April 25, 1961 R. F. RUTZ 2,981,874

HIGH SPEED, HIGH CURRENT TRANSISTOR

Filed May 31, 1957

INVENTOR.
RICHARD F. RUTZ

BY Alvin J. Riddles
AGENT

United States Patent Office 2,981,874

Patented Apr. 25, 1961

2,981,874

HIGH SPEED, HIGH CURRENT TRANSISTOR

Richard F. Rutz, Fishkill, N.Y., assignor to International Business Machines Corporation, New York, N.Y., a corporation of New York Filed May 31, 1957, Ser. No. 662,649

8 Claims. (Cl. 317—235)

This invention relates to transistors and in particular to a high speed, high current handling transistor structure.

In the development of transistors that are capable of handling large currents it has frequently been necessary to compromise with the frequency response of the device in order to provide the physical size necessary to handle large currents. In most transistor structures, thus far available in the art, the semiconductor phenomena of minority carrier storage and diffusion time have resulted in long turn on and turn off times in a transistor and the physical size of the devices have been reduced to provide a smaller physical distance for minority carriers to diffuse or be stored. This has placed a limitation on transistors in that their physical size has heretofore been limited by how large the device could be made before the turn on and turn off delay due to the minority carrier diffusion time and storage appreciably affected the performance.

What has been discovered is a high speed, high current transistor wherein a combination of two electric fields in the base region operate to speed up minority carrier transit time and to remove stored minority carriers and at the same time these fields cooperate to enhance the emitter injection efficiency and the minority carrier transport factor of the device so that higher amplification factors over wider current ranges are achieved.

A primary object of this invention is to provide a high speed, high current transistor.

Another object is to provide an internal field focused, graded base transistor.

Still another object is to provide a transistor structure having an alloyed emitter, an internal field in a graded resistivity base and a PN hook collector.

Other objects of the invention will be pointed out in the following description and claims and illustrated in the accompanying drawings, which disclose, by way of example, the principle of the invention and the best mode, which has been contemplated, of applying that principle.

Figures 1, 2:
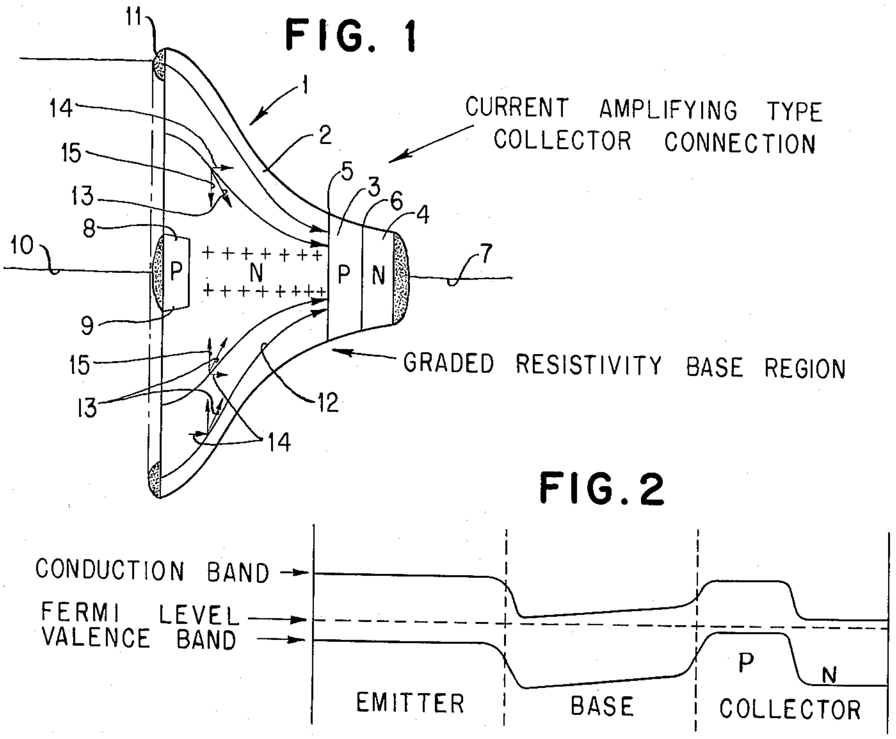
Fig. 1 is a diagram of the transistor structure of this invention.
Fig. 2 is a perspective view of the energy level in the regions of the transistor of Fig. 1.

Referring now to Fig. 1, the transistor 1 of this invention is shown comprising a body of semiconductor material, such as, germanium or silicon having a base region 2 of one conductivity type, here illustrated as N type. A "PN hook" type current amplifying collector is shown comprising regions 3 and 4 of P and N type conductivity, respectively forming junctions 5 and 6. An ohmic external collector connection 7 is shown made to region 4. A small area junction emitter is applied to the base region 2 and is illustrated as a P region 8 and junction 9. An ohmic external emitter connection 10 is applied to the P region 8. A circular ohmic base connection 11 is applied to the base region 2 in specific spaced and surrounding relationship to the emitter to provide an internal field in the base region 2, to be later described. The base region 2 is provided with a resistivity gradient varying from a low value at the emitter junction 9 to a higher value at the collector junction 5.

The transistor of Fig. 1 is provided with a combination of structural features that operate to influence the direction and velocity of the minority carriers within the base region during conduction. Considering first, the base region 2, the region is provided with a gradient of resistivity varying from a low value of the emitter junction 9 to a higher value at the collector junction 5. The graded resistivity base region produces an electric field within the base region of the transistor 1 and the presence of this electric field adds a drift component to the diffusion component of motion of the carriers in the base region so that injected minority carriers, introduced at the base region through the emitter junction 9, can reach the collector junction 5 more rapidly and the carriers that are stored when the input returns to the no signal level will be more rapidly swept out of the base region. An understanding of the effect of the built in field due to the resistivity gradient in the base region 2 may be observed from the graph shown in Fig. 2 which is a description of the energy level variation from emitter to collector of the transistor 1 in Fig. 1.

Reference is here made to Patent No. 2,810,870 which describes a device with one type of field in the base.

Referring now to Fig. 2, the energy level of the conduction and valence bands of semiconductor material are parallel to the Fermi level in the emitter in the collector regions. This parallelism is distorted in the base region with the high energy level being at the high resistivity which is at the collector junction 4. Since it is established in the art that minority carriers, holes in this example, seek the highest energy level, the minority carriers injected by the emitter of this transistor will then be acted upon by an internal built in electric field which will cause them to drift in the direction of the collector junction 5. It may then be seen that this will appreciably affect the transit as well as the storage time and enable operation at very high frequency. This field has been referred to in the art as a "Drift" field. It has been established that the optimum increase of resistivity with distance from the emitter in the base region should be essentially an exponential function of the distance from the emitter junction and it has been found that the method of vapor diffusion of impurities into a semi-conductor crystal approaches this function.

The electric field, above described, is a built-in characteristic of the material employed in the fabrication of the base region 2 of the transistor 1. In addition to this field, superimposed thereon, an internal focused electric field is provided in the base region 2 by the manner in which the carries are caused to flow in the base region 2. This operates to further enchance the advantages not heretofore found in the art. The focused electric field is accomplished by the provision of a broad area, in comparison to point contacts, such as have been used in the art, high injection efficiency, emitter shown in this illustration as comprising P region 8 and junction 9 placed on the base region within the diffusion distance of the average carrier during the carrier lifetime of the semiconductor material, from a current amplifying type of collector shown in the illustration of Fig. 1 as the "PN hook" type collector known in the art here illustrated as comprising regions 3 and 4 separated by junctions 5 and 6. A base contact 11 is applied to the same side of the base region 2 as the emitter and is placed in spaced circular relationship thereto. The method of operation of the focused electric field present in the base region 2 is as follows. Assuming the base region 2 to be N type conductivity and the emitter region 8 to be P type. The above described "PN hook" collector comprising regions 3 and 4 and junctions 5 and 6 is a current amplifying type collector, and as such, it has an intrinsic amplification factor in the vicinity of $1+b$ where $b$ is the ratio of electron mobility to hole mobility in the base region 2 and as a result of which, for each hole that arrives at the collector junction 5 from the emitter junction 9 $\alpha-1$, additional electrons are liberated which flow to the base contact 11. The base contact 11 in this embodiment is a circular construction with the emitter in the center and with this construction the flow of electrons from the collector junction 5 to the base 11 when holes injected at the emitter 9 arrive at the collector junction 5 enhances the axially symmetric electric field in the base region 2 around the emitter. An intrinsic alpha of the collector greater than $1+b$ is a guide helpful to insure enhancement of the electric field as hole current is increased, since conductivity modulation alone tends to overcome the electron current by a factor $b$.

The guide that the intrinsic alpha of the collector ($\alpha^*$) should be in the vicinity of or greater than $1+b$ to establish proper field focusing may be seen from the following. The electric field in the base is directly related to the currents and charges near the collector. Considering for simplicity, the transistor of Fig. 1 to be made of homogeneous germanium semiconductor material with no drift field, the electron ($J_n$) and the hole current ($J_p$) in the base are dependent on the relationships shown in Equations 1 and 2.

$$J_n = be\mu_p n\vec{E} \quad (1)$$

$$J_p = e\mu_p p\vec{E} \quad (2)$$

where $\mu_p$ is the hole mobility, $e$ is the magnitude of the electronic charge, $$\vec{E}$$

is the electric field indicated by arrows 13 in Fig. 1, $n$ and $p$ are actual carrier concentrations and $b$ is the ratio of electron mobility to hole mobility.

Considering an increase in hole current to $J_p+\Delta J_p$, there will then be an increment $\Delta J_n$ in $J_n$ and an increment $\Delta n=\Delta p$ in $n$ and $p$. Assuming $\Delta p$ and $\Delta J_p$ have the same sign then:

$$\Delta J_n = be\mu_p(n\Delta\vec{E}+\vec{E}\Delta p) \quad (3)$$

$$\Delta J_p = e\mu_p(p\Delta\vec{E}+\vec{E}\Delta p) \quad (4)$$

The ratio $\Delta J_n/\Delta_p$ is generally denoted by $\alpha^*-1$, where $\alpha^*$ is the intrinsic amplification factor of the collector as as described above and according to Equations 3 and 4 it may be stated as:

$$(\alpha^*-1) = b\frac{n\Delta\vec{E}+\vec{E}\Delta p}{p\Delta\vec{E}+\vec{E}\Delta p} \quad (5)$$

Since $n>p$ on the right hand side of the expression in Equation 5 if all terms in the fraction are positive $$(a^*-1)>b \quad (6)$$

On the other hand if $$\Delta\vec{E}$$

is negative $$(a^*-1)<b \quad (7)$$

In the case of (6) then an increase in hole current will increase the field everywhere in bulk in the base region 2.

Therefore as a guide to establishment of the focusing field $\alpha^*$ should be in the vicinity of or greater than $1+b$.

The above discussion is advanced neglecting the effect of diffusion currents and of certain assumptions; namely, drift field in the base. In this structure the diffusion currents can be considered to be negligible. The effect of the drift field will augment the effect of the focused field.

The term "high amplification factor collector" is considered to mean a current amplifying collector having an intrinsic in the vicinity or greater than $1+b$.

This electric field has a component which tends to direct and accelerate holes injected at the emitter junction 9 toward the collector junction 5. Also as a result of the electric field, the emitter junction 9 becomes biased more in the direction of easy current flow at the region directly opposite the collector junction 5 than at more distant points and hence, the emission of holes to be confined and restricted to the region opposite the collector. This feature, in a graded resistivity base region device wherein an alloyed emitter is applied has considerable value in that the injection efficiency of a junction emitter, known in the art as $\gamma$, is determined by the ratio of the resistivities of the semiconductor material on each side of the junction formed by the emitter and the base region. The result of alloying is to form a PN junction having a constant resistivity on one side and a varying resistivity on the other side so that the effect of the above described electric field, in restricting the area of emission of the junction, acts to insure constant $\gamma$ over the surface of the emitter junction by restricting the emission to the portion of the surface where the resistivity of the base region 2 is constant, namely parallel to the collector junction 5.

As may be seen from the structure of Fig. 1, the portion of the collector and base region have been removed by an operation such as etching. This is done to make the collector area comparable to that of the emitter thereby further enhancing the radial component of the field (arrows 13 in Fig. 1). Two further advantages are gained here, these are reduced collector capacity and reduced hole storage in the base region 2.

Referring now to Fig. 1, the current flow due to majority carriers, electrons in this illustration is illustrated symbolically as arrows 12 in the base region 2 flowing from the base 11 to the collector junction 5 and the vectors of the electric field which are tangent to and in the same direction as the lines of current flow 12 at each point in the base region 2 are similarly symbolically illustrated as arrows 13. Each of these field vectors is shown as having an axial and a radial component labeled elements 14 and 15 respectively. These arrows set up an electric field which operate to confine the injection of minority carriers, holes in this illustration shown in the base region 2 as ++++ to a small region. Associated with this electron current is an electric field or potential which varies from negative at the collector junction 5 for this illustration to a more positive potential at the base 11. This electric field has the proper direction to direct and accelerate the positively charged holes toward the negative collector junction 5. The field vectors shown symbolically in Fig. 1 as arrows 13 are tangent to and in the same direction as the lines of electron current flow and are indicative of the forces applied to the positively charged holes by the electric field. Since in this embodiment the emitter is in the center of a hole in the base connection 11 it may be seen that the holes injected in the barrier 9 will tend to be directed and accelerated by the electric field toward the center of symmetry of the transistor where the collector junction 5 is located. It is true that at large distances the electric field will be weak. However, the great majority of holes will be emitted directly opposite to the collector junction 5 as we have shown. To repeat this then, the electric field in the base region 2 is greatly strengthened as larger and larger quantities of holes arrive at the collector junction 5. This biases a restricted region of the large emitter junction 9 much further in the direction of easy current flow so that essentially all of the injected holes will emanate from this small region directly opposite the collector 5. It should be noted here that as a result of this electrode arrangement, a relatively speaking large junction emitter has been made electrically small. By virtue of the electric field set up in the crystal by the arrangement of the electrodes the majority carrier current in the crystal is caused to set up an electric field which in turn confines the area of injection of holes and directs and accelerates the injected holes inside the crystal toward the collector.

Further, since the area of injection tends to be restricted by the field to the region of the emitter junction directly opposite the collector junction 5, essentially high injection efficiency, (gamma) for the emitter is realized. Continuing further, it may now be seen from the above description that once a sufficient number of emitted holes are collected, the action of the field and the increased hole concentration caused by it together produces an internal positive feedback condition in the base region 2 which proceeds until the internal forward resistance of the transistor is very low and the current in the collector circuit approaches a value limited essentially only by the impedance of the collector circuit. The result of this is that the geometry of the electrodes applied to the crystal of the transistor are used to take advantage of sweeping fields in the base region such that the flow of majority carriers from the collector to base produces an electric field in the crystal which by the structural geometry of the crystal is brought sufficiently near to the emitter to accelerate and direct minority carriers to the collector and at the same time this electric field, by its influence, introduces the additional advantages of the reduction of minority carrier storage and causing a negative resistance in the emitter characteristic such that the emitter potential becomes negative at high currents and due to the small but unavoidable capacitance of the emitter and its lead, is kept negative after the end of the applied input signal, serving thereby as an additional point of collection for stored minority carriers for a short time. In order to provide the electric field above described, it has been found that there is a certain range of distances between emitter, base and collector electrodes in transistors that would permit the above field to be effective. This range of distances is affected by the carrier lifetime of the semiconductor material, the resistivity of the semiconductor material and by the collector potential applied to the transistor. The range of distances is governed by the requirement that the emitter to collector spacing be separated on the semiconductor crystal by sufficient distance that "punch through" due to the collector potential applied to the transistor does not effect the transistor characteristics. "Punch through" is defined in the art as the extension of the depletion region associated with a reverse biased junction through the crystal until it influences the injection of carriers by the emitter. It should be here noted that as a result of the gradient of resistivity provided in the base region 2 of this transistor the physical distance throughout the base region traversed by the depletion region associated with the collector junction 5 becomes less and less as the resistivity decreases so that much higher punch through voltages are available with this type of transistor construction. An upper limit on electrode spacing between emitter and collector in order that the internal positive feedback may exist is in the vicinity of the diffusion distance of the average carrier during the carrier lifetime of the particular semiconductor material of which the transistor is made. This is true because the internal losses in the crystal, such as recombination, are so great that the concentration of minority carriers sufficient to produce this feedback condition cannot be developed. Several devices embodying the features of this transistor have worked well when the emitter to collector spacing was within the diffusion distance of the average carrier during the carrier lifetime of the semiconductor material and the emitter contact with the N region is made in an aperture in the base contact having a diameter within five times the diffusion distance for the average excess carrier during the carrier lifetime of the semiconductor material. In order to insure the internal positive feedback action without requiring unduly high gain from the collector, the injection efficiency of the emitter (gamma) should be close to unity such as can be achieved with the junction emitter.

Figures 3, 4:
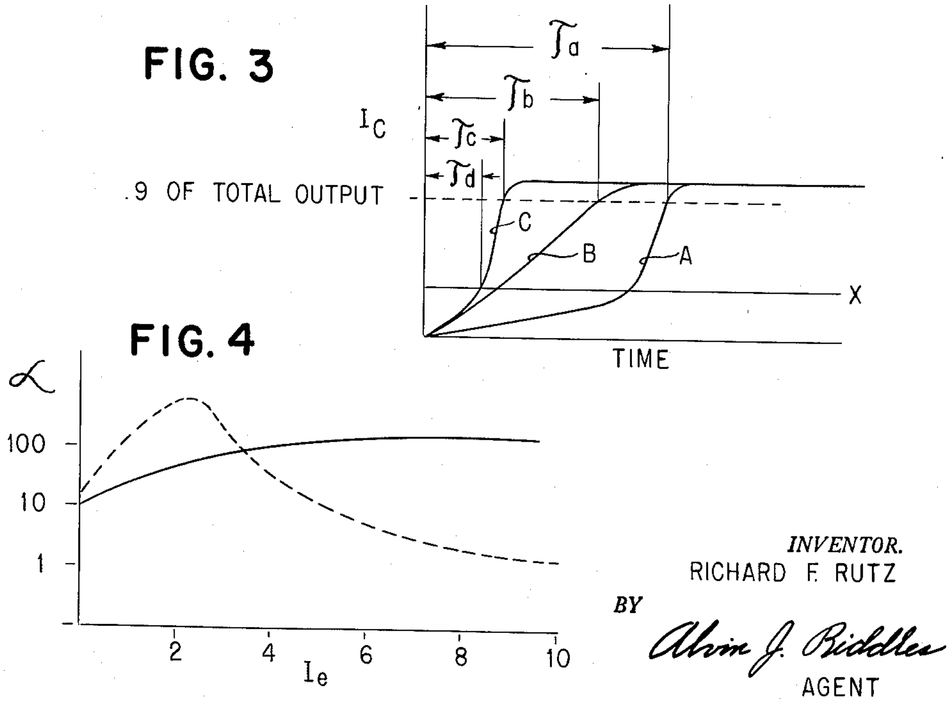
Fig. 3 is a graph illustrating the reduced delays in this transistor.
Fig. 4 is a graph illustrating the improved amplification characteristics of this transistor.

Since the effect of the field in the base region 2, due to the gradient of resistivity therein and the effect of the internal electric field produced by the relationship of the electrodes operates in augmenting relationship. Several unexpected effects are achieved in the performance of the transistor of Fig. 1 as a result of the combination of these two fields in a base region. A first of these two effects is that the reduction in (turn on) and (turn off) time is much greater than would be expected. Referring now to Fig. 3, a graph is shown of a comparison of the output rise time of this transistor with the output rise times of other types of transistors known in the art each with the same base width. Referring now to curve A the output characteristic is shown of a transistor having a current amplifying collector ($\alpha>1+b$). It will be noted that the rise time of the output is slow until the characteristic intersects line X at which time internal feedback fields in the base region operate to provide a sharp increase in rise time. In curve B the output current of a "Drift" type standard three zone transistor is shown. In this curve the "Drift" field operates to begin the rise time with a very short delay due to the absence in this transistor of a current amplifying type collector internal feedback fields on the base region do not build up as current increases; hence, rise time depends on drift and diffusion only. In curve C the output characteristic of the transistor of this invention is shown. Here, the time is very short until the output begins to rise and the internal field is operable to rapidly advance the output current to full output level. To provide a basis of comparison, a dotted line has been drawn representing 0.9 of total output and the respective delays in turn on time are labeled $\tau_a$, $\tau_b$, $\tau_c$, and $\tau_d$. Where $\tau_d$ is the time required for sufficient minority carriers to reach the collector and initiate internal feedback action, illustrated as level X, $\tau_c$ represents the time to 0.9 total output for the transistor of this invention, $\tau_b$ represents the time to 0.9 total output for a "Drift" transistor and $\tau_a$ represents the time to 0.9 total output for a transistor with a current amplifying collector and no "Drift" field. Similarly in turn off time progressive reduction in delay of unequal nature are shown by the combined advantages of these fields in the base region 2.

Another advantage of considerable importance in the art is achieved by the combination of these fields. This advantage is the avoiding in the transistor of this invention of a phenomenon referred to in the art as alpha crowding which effectively limited the high current performance of the devices available heretofore in the art. The phenomenon of alpha crowding is illustrated in Fig. 4 in showing as indicated by the dotted line alpha for a particular device has an optimum value for a given quantity of an emitter current and that for values of emitter current in excess of the optimum, a reduction in performance of the device is exhibited. As a result of the combination of the two fields in the device of this invention, the fields operate to provide an output characteristic of the type shown as the solid line in Fig. 4 wherein there is no optimum $\alpha$ evidenced within the entire useful current carrying capacity range of the device so that for high values of output current the amplification factor and the efficient overall performance of the device continues to improve. At exceptionally high currents the gain will decrease but these currents are beyond the normal operating range of these devices. This is believed to be due to the action of the combined fields in the base region operating to reduce internal losses in the transistor and is a considerable advantage in the art.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A transistor including, in combination, a semiconductor body, a broad area high injection efficiency emitter connection to said semiconductor body, a P-N hook type collector connection to said body, the spacing from said emitter to said collector being within the average diffusion distance of the carriers during the carrier lifetime of the material of said semiconductor body, the resistivity of said semiconductor body varying from a value which is low adjacent to said emitter to a value which is higher adjacent to said collector and base electrode means for controlling minority carrier flow in said semiconductor body between said emitter and said collector affixed in a region distinct from said emitter and producing an internal field therebetween.

2. The transistor of claim 1 wherein said emitter is of the alloy junction type.

3. The transistor of claim 1 wherein said minority carrier control means comprises a circular ohmic base connection to said base substantially surrounding said emitter and separated from said emitter a distance less than five times the diffusion length of the average carrier during the carrier lifetime of said base.

4. The transistor of claim 3 wherein said emitter is of the alloy junction type.

5. A transistor including, in combination, a semiconductor body, a broad area high injection efficiency emitter connection to said semiconductor body, a P-N hook type collector connection to said body, the spacing from said emitter to said collector being within the average diffusion distance of the carriers during the carrier lifetime of the material of said semiconductor body, the resistivity of said semiconductor body varying from a value which is low adjacent to said emitter to a value which is higher adjacent to said collector and means for controlling minority carrier flow in said semiconductor body between said emitter and collector comprising ohmic base electrode means affixed in a region distinct from said emitter and said collector and positioned to produce an internal field therebetween.

6. The transistor of claim 5 wherein said emitter is of the alloy junction type.

7. The transistor of claim 5 wherein said minority carrier control means comprises a circular ohmic base connection to said body substantially surrounding said emitter and separated from said emitter a distance less than five times the diffusion length of the average carrier during the carrier lifetime of said body.

8. The transistor of claim 7 wherein said emitter is of the alloy junction type.

References Cited in the file of this patent

UNITED STATES PATENTS

| | | |
|---|---|---|
| 2,793,145 | Clarke | May 21, 1957 |
| 2,810,870 | Hunter et al. | Oct. 22, 1957 |
| 2,811,653 | Moore | Oct. 29, 1957 |

FOREIGN PATENTS

| | | |
|---|---|---|
| 739,294 | Great Britain | Oct. 26, 1955 |